United States Patent [19]

Grabmaier

[11] 4,305,776
[45] Dec. 15, 1981

[54] METHOD FOR PRODUCING DISC OR BAND-SHAPED SI CRYSTALS WITH COLUMNAR STRUCTURE FOR SOLAR CELLS

[75] Inventor: Josef Grabmaier, Berg, Fed. Rep. of Germany

[73] Assignee: Siemens Aktiengesellschaft, Berlin & Munich, Fed. Rep. of Germany

[21] Appl. No.: 92,637

[22] Filed: Nov. 8, 1979

[30] Foreign Application Priority Data

Nov. 23, 1978 [DE] Fed. Rep. of Germany ....... 2850805

[51] Int. Cl.³ .................... C30B 29/00; C30B 19/12
[52] U.S. Cl. ................................. 156/605; 156/607; 156/DIG. 84
[58] Field of Search ....... 156/607, DIG. 88, DIG. 84, 156/DIG. 97, 605, DIG. 89, 617 H, DIG. 64; 148/1.5, 171; 427/86

[56] References Cited

U.S. PATENT DOCUMENTS 3,341,361 9/1967 Gorski ..................... 156/DIG. 88
4,169,739 10/1979 Lindmayer ............... 156/DIG. 88

FOREIGN PATENT DOCUMENTS 2508803 3/1978 Fed. Rep. of Germany .
5261180 5/1977 Japan ........................... 156/617 H
1539244 1/1979 United Kingdom .

OTHER PUBLICATIONS

Electronics Apr. 4, 1974, Rosenblatt 99–111.

Primary Examiner—Hiram Bernstein
Attorney, Agent, or Firm—Hill, Van Santen, Steadman, Chiara & Simpson

[57] ABSTRACT

Si-crystals with columnar structures are produced by contacting a silicon melt with a melt-resistant carrier body having periodically spaced crystallization-seed centers on a surface thereof facing the melt, establishing a controlled temperature gradient at the interface between the carrier body surface and the melt so that crystallization of the melt onto the seed centers occurs and then removing the body with the adhering crystal layer from the melt. In a preferred embodiment, an elongated traveling web having a select hole pattern therein functioning as the seed centers, is utilized as a carrier body.

11 Claims, 2 Drawing Figures

METHOD FOR PRODUCING DISC OR BAND-SHAPED SI CRYSTALS WITH COLUMNAR STRUCTURE FOR SOLAR CELLS

BACKGROUND OF THE INVENTION

1. Field of the Invention

The invention relates to silicon crystals useful in solar cells and somewhat more particularly to a method and apparatus for producing disc or band-shaped silicon crystals with columnar structures.

2. Prior Art

When solar cells are produced from silicon, the most economically available silicon material should be utilized since the requirements for such component elements relative to crystal quality are not as high as those required in producing semiconductor component elements useful in integrated circuits.

Accordingly, it is desirable to find a means of producing silicon crystals which is simple and economical and does not involve excessive loss of materials. Further, such material-wasting and time-consuming steps as, for example, sawing a silicon bar produced by traditional crystal-growth methods, into crystal discs as well as lapping and polishing of such disc surfaces should be eliminated.

German Offenlegungsschrift (hereinafter DT-OS) No. 25 08 803 suggests that plate-shaped silicon crystals having a columnar structure are very useful as base materials for producing solar cells whereby an efficiency of more than 10% can be achieved. The process of producing such silicon crystals set forth in this DT-OS generally comprises providing a melt composed of a pre-purified polycrystalline silicon, feeding such melt into a cooled graphite mold of suitable shape and allowing the so-cast melt to solidify in the mold over a temperature gradient. After solidification, the plate-shaped silicon crystals have a columnar structure formed in a direction of the shortest axes of the monocrystalline crystal areas with crystallographic preferred orientation and exhibit semiconductive properties. In the manufacture of solar cells, crystal discs of about $100 \times 100$ mm$^2$ and a thickness of about 500 $\mu$m are sawed from the plates produced in the above-described manner with diamond saws conventional in semiconductor technology. Solar cells produced in accordance with known techniques from such discs have an efficiency which fluctuates between about 8.2% at a cell edge, up to 10.5% at the center of the cell. The efficiency thus achieved very nearly matches that of solar cells produced from monocrystalline silicon, which exhibit an efficiency of about 12% to 14%. However, the process described by the above-referenced DT-OS requires a sawing process to divide the plates into discs and such sawing cannot be omitted. Further, the size of the plates is determined by the size of the casting mold required for their manufacture.

Another process for producing economical silicon is suggested in *Electronics*, page 108, Apr. 4, 1974. With this process, a polycrystalline silicon band having a length of at least 1 meter is produced by casting a silicon melt onto a cooled, traveling carrier body composed of molybdenum or onto a traveling band coated with a silicon nitride layer so that the polycrystalline band is produced in a manner somewhat similar to assembly-line principles. However, the resultant silicon material does not have columnar structure so that solar cells produced therefrom exhibit an efficiency of less than about 5%.

SUMMARY OF THE INVENTION

The invention provides a method and apparatus for producing silicon crystal discs and bands having columnar structures, which are useful in producing solar cells with increased efficiency. In accordance with the principles of the invention, such discs and bands are produced without requiring a sawing process, which causes material and time losses. Further, a solidification limited to casting molds, which requires additional work steps and devices and also determines the size of the silicon plate manufactured in that manner, is avoided.

In accordance with the principles of the invention, a carrier body having a surface thereof provided with periodically spaced-apart crystallization seed centers for growth of desired columnar structure, is moved into contact with a contained silicon melt so that the carrier body surface having the seed centers thereof contacts the upper surface of the melt and a controlled temperature gradient is established at the interface of the contacting surfaces and crystallization occurs. Thereafter, the carrier body with the adhering crystals is removed from the melt.

In a preferred embodiment of the invention, the carrier body comprises a band composed of a silicon melt-resistant material, such as quartz glass, graphite or zirconium oxide and a surface thereof is provided with a select hole pattern, such as comprised of hexagonally-shaped holes, each having an axial width ranging from about 100 to 300 $\mu$m, with spacing between one hole center to another hole center in a range of about 150 to 350 $\mu$m. Dopants may be provided for incorporation in the produced silicon bodies and the temperature gradient can be established by cooling the interface between the carrier body and the melt surface, as by an inert gas stream directed onto the carrier body from above.

In another preferred embodiment of the invention, the carrier body may comprise an elongated traveling web or band which is unwound from a storage roll positioned adjacent a melt-container and guided into surface contact with the silicon melt within such container so that crystallization occurs at the surface boundary between the melt and the traveling web. Optionally, after solidification, the traveling web may again be rewound onto the storage roll. This embodiment is a very economical flow-through process, which in an exemplary process occurs at a web velocity of about 1 meter per minute and provides silicon discs and/or bands having a thickness of about 200 $\mu$m.

DESCRIPTION OF THE PREFERRED EMBODIMENTS

The present invention provides a method and apparatus for producing disc or band-shaped silicon crystals with columnar structures which are useful in the manufacture of solar cells by bringing molten silicon into contact with a carrier body composed of a material resistant to the melt and allowing the melt to solidify on seed centers within the carrier body at a temperature gradient established at the contacting surfaces of such carrier body and silicon melt.

Figure 1:
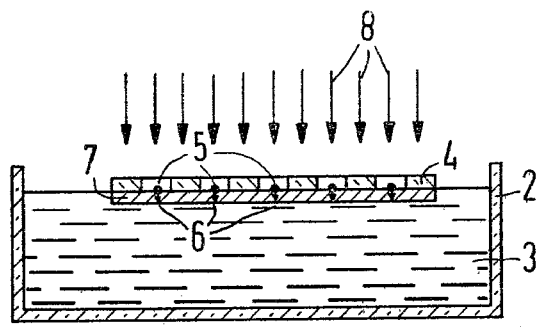
FIG. 1 is an elevated somewhat schematic cross-sectional view of an apparatus useful to practice of the invention.

Referring now to FIG. 1, an operative melting vat 2 is provided with a silicon melt 3. Since silicon has a relatively high melting point (about 1430° C.), a relatively steep temperature gradient exists within the vat because of strong heat radiation. At the uncovered melt surface a relatively steep temperature drop occurs within the upper, approximately 1 mm thick layer of melt. By covering the upper melt surface, this temperature drop can be substantially smoothened. Thus, it is possible to generate a temperature profile on the melt surface corresponding to the covering when the melt surface is partially covered, for example, by means of a carrier body 4, which may comprise a net-like structure. Points of the uncovered melt surface which are at a greater distance from the carrier body are, accordingly, the locations of the lowest temperature. In the absence of external crystallization seeds, a spontaneous seed formation occurs in such low temperature areas. These points, or actually mid-points, thus represent crystallization nuclei 5, with the greatest nucleus growth velocity in the direction of a temperature gradient which, in the present instance, is directed perpendicularly to the melt surface (diagrammatically indicated by arrows 6), with a negligible diffusion of the melt parallel to the melt surface. Therefore, silicon crystallizes onto the underside of the carrier body 4 with the crystal orientation perpendicular to the surface of the carrier body 4. A silicon layer 7 with columnar structure is thus attained whereby the crystal columns arise per surface unit and the cross-sections of the individual crystal columns are in direct relationship to the openings or holes 5 in the carrier body 4. In instances where the carrier body is a net-like body, a silicon layer 7 is attained whose columnar cross-section corresponds to the size of the mesh-like openings in the net structure.

However, the net-like carrier body, which may be an elongated band provided with a desired pattern of holes, may be replaced by a foil-like carrier body provided with a pattern of foreign crystallization seeds on the side thereof facing the melt, i.e., to attain a quasi-inoculation of the melt. Such foreign seeds, in instances where the generation of a uniform columnar structure is desired, are preferably applied at periodic spaced-apart intervals along the surface of the carrier body.

Because of the high surface tension of molten silicon, the surface areas between the individual holes of the carrier body can be extremely thin so that the carrier body assumes the form of a net in a first approximation. This type of covering body is advantageous since, given a uniform width of mesh openings the individual crystal columns of the silicon layer grow with a very uniform cross-section since the axial width of the mesh openings in the carrier body net, determines the columnar cross-section.

The monocrystalline columnar-like growth in the silicon layer is further encouraged by cooling from the top, such as via a gas stream. In a preferred embodiment, a stream 8 of an inert gas is directed downward onto the top side of a carrier body having holes therein.

Because silicon has a relatively high melting point (1430° C.) and quartz glass is, at best, only slightly moistened by molten silicon, in accordance with the preferred embodiment of the invention, the carrier body may be composed of quartz glass wool compressed to form an elongated web or mat. For achieving a desired columnar structure with crystal columns of uniform cross-section, select geometrically-shaped holes may be provided in such a covering body at periodic spaced-apart intervals. A hexagonal arrangement of holes is particularly preferable. In a preferred embodiment for forming particularly useful columnar structures, holes are utilized which have an axial width in a range of about 100 to 300 μm and are spaced apart so that the interval from hole center to hole center is in the range of about 150 to 350 μm.

In other embodiments of the invention, quartz glass wool may be replaced by graphite or zirconium oxide fibers and these materials can also be processed into mats or elongated webs.

It is advantage in further processing of the produced silicon as well as in the use of the silicon discs or band-shaped silicon layers during the production of solar cells (having a thickness of approximately 200 to 500 μm) to allow the grown silicon layer to remain in contact with the carrier body, whether it be a finite dimensioned mat or a net-like body. By proceeding thusly, the silicon layer or the solar cells produced therefrom becames self-supporting with all of the accompanying advantages. For example, by proceeding in this manner, substantially less silicon material is required. Further, given a net-like carrier body, the applied silicon layer can be subsequently provided with a conductive covering layer or with conductive tracks. In instances where a foil-like carrier body is utilized, it is preferrable to apply a conductive layer to such body before coating it with silicon. Doped layers may be utilized as conductive layers or tracks. Because of the relatively high melting point of silicon (1430° C.), doped layers comprised of tin oxide (having a melting point greater than 1900° C.) or zinc oxide (having a melting point of about 1975° C.) or mixtures of such dopant compounds are particularly useful for this purpose.

Figure 2:
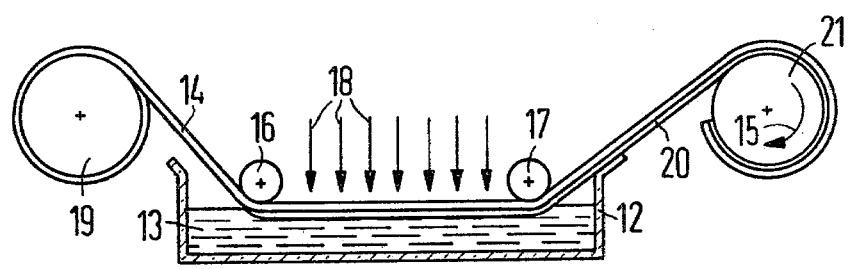
FIG. 2 is a somewhat similar view of another embodiment of an apparatus useful in the practice of the invention.

FIG. 2 schematically illustrates a device useful in the practice of the invention. A silicon melt 13 is confined in a suitable melting vat 12, for example composed of quartz. In preferred embodiments, the melt 13 is produced from purified polycrystalline silicon. An elongated, band-shaped carrier body 14 composed of a silicon-melt resistant material is guided into surface contact with the upper surface of the melt 13 in such a manner that it continuously at least partially covers the melt surface while barely touching it. In an exemplary embodiment, the carrier body 14, which simultaneously functions as a cover on the melt surface and as a crystallization substrate, is composed of quartz glass wool which has been compressed to form an elongated band having holes (not shown) of a specific axial width (preferrably about 150 μm) and at select spaced-apart intervals along the length and width of the band. Such band may be stored onto a supply role 19 positioned adjacent one end of the vat 12 so that during operation, the band 14 is guided from role 19 into surface contact with the melt 13 via a deflection role 16 and an immersion role 17. A cooled gas stream 18, comprised of an inert gas, may be directed onto the back or top side of the web or band 14 as it contacts the melt to establish a controlled temperature gradient at the interface between the melt and the band or carrier body and thereby promote crystallization of silicon onto the seed centers in the band. A silicon layer 20 having a columnar structure crystallizes onto the front or bottom side of the band 14 and is guided from the vat 12 and onto a storage roller 21, rotating in the direction of arrow 15.

Silicon layers manufactured in accordance with the principles of the invention are extremely smooth and have a very high surface planarity. Such silicon layers can be produced directly with a desired layer thickness (a few 100 $\mu$m) and traditional sawing, lapping or polishing processes, typically necessary for producing silicon crystal disks for solar cells are superfluous and can be omitted. In accordance with desired solar cell dimensions, the basic elements for the solar cell (silicon discs) are simply separated from the fabricated silicon layer or band, which if desired, may be wound-up.

Further, the principles of the invention allow one to economically manufacture silicon substrates for relatively large-surfaced, amorphous solar cells.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

I claim as my invention:

1. A method of producing disc or band-shaped silicon crystals having a columnar structure, useful for manufacture of solar cells, comprising:
   contacting a surface of molten silicon with a silicon melt-resistant reticular carrier body having substantially uniform mesh openings substantially matched to the columnar structure on a surface thereof so that such surface is in direct contact with the molten silicon;
   establishing a controlled temperature gradient at the interface between said reticular carrier body and said molten silicon so that crystallization of silicon occurs in said mesh openings; and
   removing said carrier body from said molten silicon surface with an adherent silicon layer on said carrier body.

2. A method as defined in claim 1 wherein said carrier body is in the form of an elongated band, said band having a select pattern of holes defining the crystallization seed centers and said temperature gradient is established by cooling such band.

3. A method as defined in claim 2 wherein a flow-through process is utilized whereby the elongated band is unwound from a roller, guided across the molten silicon in surface contact therewith so that crystallization occurs on such band and, optionally, the band is then rewound onto a roller after solidification of a silicon layer thereon.

4. A method as defined in claim 3 wherein said elongated band is moved across the silicon melt at a velocity of about 1 meter per minute whereby a silicon layer having a thickness of about 200 $\mu$m is crystallized onto said band.

5. A method as defined in claim 1 wherein said carrier body is provided with a select pattern of holes defining the crystallization seed centers and said temperature gradient is established by directing an inert gas stream onto the surface of said carrier body.

6. A method as defined in claim 5 wherein said holes within the carrier body each have an axial width in the range of about 100 to 300 $\mu$m.

7. A method as defined in claim 5 wherein said holes within the carrier body are spaced from one another so that the distance between a hole center to an adjacent hole center is in the range of about 150 to 350 $\mu$m.

8. A method as defined in claim 5 wherein said holes within the carrier body are hexagonally arranged.

9. A method as defined in claim 1 wherein said carrier body is composed of a material selected from the group consisting of quartz glass, graphite and zirconium oxide and comprises a compressed mat or foil of such material.

10. A method as defined in claim 9 wherein said carrier body is provided with a doped layer composed of a material selected from the group consisting of tin oxide, zinc oxide and mixtures thereof.

11. A method as defined in claim 1 wherein said silicon layer produced by said method is divided, together with the carrier body, in accordance with desired solar cell dimensions.

* * * * *